(12) United States Patent
Shen et al.

(10) Patent No.: US 10,394,260 B2
(45) Date of Patent: Aug. 27, 2019

(54) GATE BOOSTING CIRCUIT AND METHOD FOR AN INTEGRATED POWER STAGE

(71) Applicant: Synaptics Incorporated, San Jose, CA (US)

(72) Inventors: Dan Shen, Irvine, CA (US); Lorenzo Crespi, Costa Mesa, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/633,527

(22) Filed: Jun. 26, 2017

(65) Prior Publication Data

US 2018/0004238 A1    Jan. 4, 2018

Related U.S. Application Data

(60) Provisional application No. 62/357,223, filed on Jun. 30, 2016.

(51) Int. Cl.
*H03K 3/00* (2006.01)
*G05F 1/46* (2006.01)
(Continued)

(52) U.S. Cl.
CPC .............. *G05F 1/462* (2013.01); *H03K 3/012* (2013.01); *H03K 17/063* (2013.01);
(Continued)

(58) Field of Classification Search
CPC ...... G05F 1/462; H03K 3/012; H03K 17/687; H03K 19/017509
(Continued)

(56) References Cited

U.S. PATENT DOCUMENTS 4,542,310 A    9/1985    Ellis et al.
6,242,973 B1    6/2001    Kong et al.
(Continued)

FOREIGN PATENT DOCUMENTS

EP    2 706 651 A2    3/2014

OTHER PUBLICATIONS

Achim Seidal et al., "Area Efficient Integrated Gate Drivers Based on High-Voltage Charge Storing," IEEE Journal of Solid-State Circuits, vol. 50, No. 7, Jul. 2015, pp. 1550-1559.
(Continued)

*Primary Examiner* — Ryan Jager
(74) *Attorney, Agent, or Firm* — Haynes and Boone, LLP

(57) ABSTRACT

Systems and methods according to one or more embodiments are provided for gate boosted drivers for integrated power stages. In one example, a gate driver includes an output stage comprising an n-channel metal-oxide-semiconductor (NMOS) pull-up transistor and an NMOS pull-down transistor, where the NMOS pull-up transistor and the NMOS pull-down transistor are coupled at an output node. The gate driver further includes a bootstrap circuit comprising a main bootstrap capacitor, where the bootstrap capacitor provides a supply voltage for driving the NMOS pull-up transistor. The gate driver further includes a high voltage generator coupled with the main bootstrap capacitor via a transistor switch and a replica bootstrap circuit comprising a replica bootstrap capacitor. The replica bootstrap circuit generates a reference voltage that regulates a drain current of the transistor switch, and the regulated drain current of the transistor switch charges the main bootstrap capacitor from the high voltage generator.

17 Claims, 5 Drawing Sheets

(51) Int. Cl.
  *H03K 17/687* (2006.01)
  *H03K 19/0175* (2006.01)
  *H03K 3/012* (2006.01)
  *H03K 17/06* (2006.01)

(52) U.S. Cl.
  CPC ... *H03K 17/687* (2013.01); *H03K 19/017509* (2013.01); *H03K 2217/0081* (2013.01)

(58) Field of Classification Search
  USPC .................................................. 327/109
  See application file for complete search history.

(56) References Cited

U.S. PATENT DOCUMENTS

| | | | |
|---|---|---|---|
| 7,253,675 B2 | 8/2007 | Aksin et al. | |
| 7,863,943 B2 | 1/2011 | Maes et al. | |
| 8,710,875 B2 * | 4/2014 | Bai | H02M 3/1588 323/284 |
| 9,261,541 B2 | 2/2016 | Maes et al. | |
| 9,847,706 B2 | 12/2017 | Zhang et al. | |
| 2015/0381159 A1 * | 12/2015 | Kawata | H03K 17/08 327/109 |
| 2016/0043072 A1 * | 2/2016 | Vielemeyer | H01L 27/0629 327/109 |
| 2016/0079844 A1 * | 3/2016 | Kinzer | H02J 7/0052 323/272 |
| 2016/0087623 A1 * | 3/2016 | Yamaguchi | H03K 17/161 327/109 |
| 2016/0105173 A1 * | 4/2016 | De Rooij | H03K 17/6871 327/109 |
| 2016/0105175 A1 * | 4/2016 | Ishimatsu | H03K 19/0016 327/109 |
| 2016/0134279 A1 * | 5/2016 | Sicard | H03K 17/687 327/109 |
| 2016/0164398 A1 * | 6/2016 | Kaya | H01L 29/7816 327/109 |
| 2016/0380625 A1 * | 12/2016 | Werker | H03K 17/168 327/109 |

OTHER PUBLICATIONS

"Design and Application Guide of Bootstrap Circuit for High-Voltage Gate-Drive IC," AN-6076, Fairchild Semiconductor Corporation, rev. 1.4, 2008, pp. 1-13.

Meyer, Philip, et al., "Providing Continuous Gate Drive Using a Charge Pump," Texas Instruments, Feb. 2011, 10 Pages, Dallas, Texas.

\* cited by examiner

GATE BOOSTING CIRCUIT AND METHOD FOR AN INTEGRATED POWER STAGE

CROSS-REFERENCE TO RELATED APPLICATIONS

The present application claims priority to U.S. provisional application No. 62/357,223 filed Jun. 30, 2016, which is fully incorporated by reference as set forth herein in its entirety.

TECHNICAL FIELD

One or more embodiments of the invention relate generally to integrated power stages and more particularly, for example, to improved gate boosted drivers for integrated power stages.

BACKGROUND

Integrated gate drivers may comprise output stage buffers including p-type metal-oxide-semiconductor ("PMOS") transistors for a pull-up path and an n-type metal-oxide-semiconductor ("NMOS") for a pull-down path. In certain high power applications, a large percentage of a die area may be occupied by a driver output stage comprising two or more high-voltage transistors capable of providing robust output currents and large gate voltages. It is desirable to implement alternative output stage buffer configurations that more efficiently use the die area. In some high-voltage applications, the PMOS transistor may be several times (e.g., over 30 times) larger compared to the NMOS transistor in its specific resistance, resulting in the pull-up path occupying more die area than the pull-down path. Technological improvements in complementary metal-oxide-semiconductors manufacturing processes have led to integration of more functionality within a smaller die area. An output stage of an integrated gate driver circuit comprising NMOS transistors for both pull-up and pull-down paths are an approach that may result in a reduced die area and lower manufacturing costs.

The output stage of an integrated gate driver utilizing an NMOS transistor for the high-side switch may use a bootstrap power supply to provide the gate overdrive voltage when the high-side NMOS transistor turns on. However, since the bootstrap capacitor, during the time when the low-side switch is not active, provides gate charge to the gate terminal of the high-side switch, power supply voltage for the buffer coupled to the high-side switch, and supplements charge lost due to leakage and quiescent currents, a relatively large bootstrap capacitor may be selected to ensure sufficient gate drive for substantially higher duty-cycles. For example, it is conventional to implement the bootstrap capacitor as discrete component. But such an arrangement generally increases manufacturing cost, pin count for an integrated circuit, and size of a printed circuit board.

There is, therefore, a continued need for die area efficient integrated gate boosted driver.

SUMMARY

The present disclosure provides systems and methods for optimizing gate boosting circuits driving integrated power stages. Embodiments of the present disclosure include NMOS transistors for an output stage of an integrated gate driver, a bootstrap circuit used to provide a voltage drive to the output stage, and a replica bootstrap circuit used to efficiently regulate the bootstrap voltage drive.

In one embodiment, a gate driver includes an output stage comprising an n-channel metal-oxide-semiconductor (NMOS) pull-up transistor and an NMOS pull-down transistor, wherein the NMOS pull-up transistor and the NMOS pull-down transistor are coupled at an output node; a bootstrap circuit comprising a main bootstrap capacitor, wherein the bootstrap capacitor provides a supply voltage for driving the NMOS pull-up transistor; a high voltage generator coupled with the main bootstrap capacitor via a transistor switch; and a replica bootstrap circuit comprising a replica bootstrap capacitor, wherein the replica bootstrap circuit generates a reference voltage that regulates a drain current of the transistor switch, and wherein the regulated drain current of the transistor switch charges the main bootstrap capacitor from the high voltage generator.

In another embodiment, a method for operating a gate driver of an integrated power stage includes charging a main bootstrap capacitor; charging a replica bootstrap capacitor; providing a supply voltage for driving a pull-up NMOS transistor from the main bootstrap capacitor; providing a reference voltage at a gate terminal of a transistor switch, wherein the reference voltage regulates a drain current of the transistor switch and wherein the regulated drain current of the transistor switch charges the main bootstrap capacitor from a high voltage generator; and conducting the drain current through the transistor switch when a voltage across the bootstrap capacitor is below the reference voltage by a threshold voltage of the transistor switch.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure may be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which.

Embodiments of the invention and their advantages are best understood by referring to the detailed description that follows. It should be appreciated that like reference numerals are used to identify like elements illustrated in one or more of the figures.

DETAILED DESCRIPTION

Figure 1:
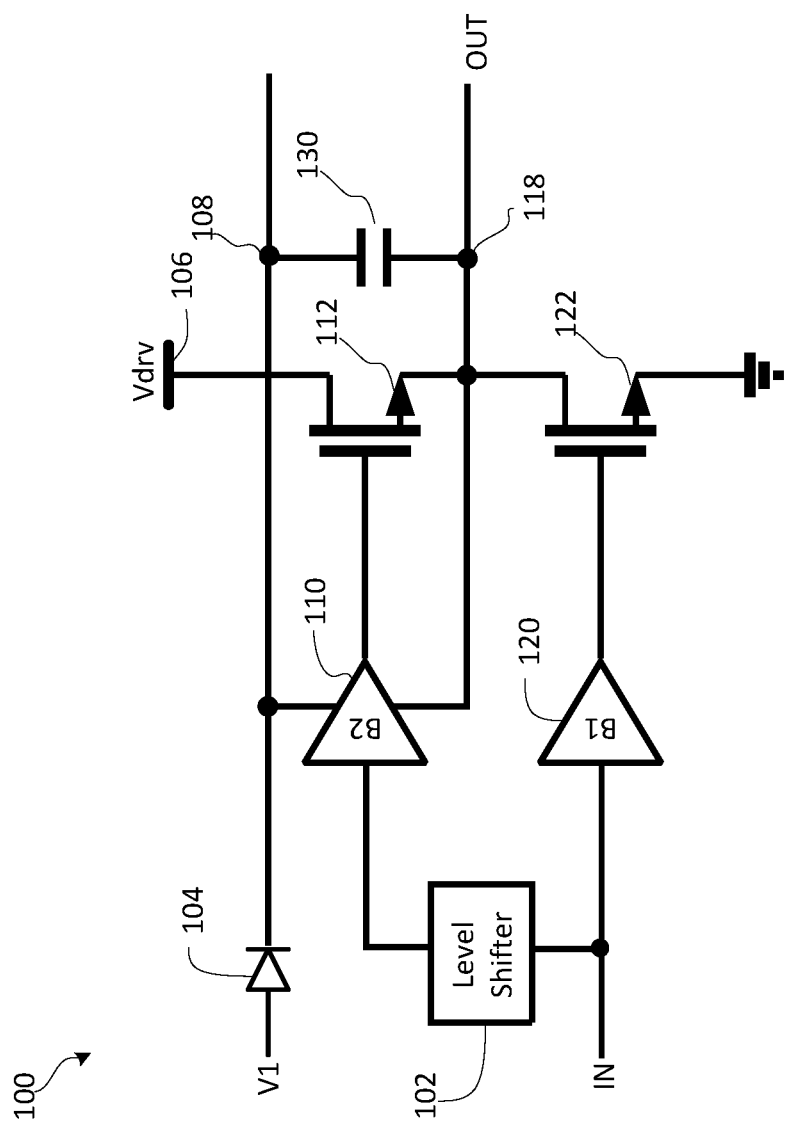
FIG. 1 illustrates an embodiment of a gate driver with a bootstrap power supply circuit.

In the description that follows, like parts are marked throughout the specification and drawings with the same reference numerals. The drawing figures might not be to scale and certain components may be shown in generalized or schematic form and identified by commercial designations in the interest of clarity and conciseness.

The present disclosure describes methods and systems for implementing an efficient gate boosting circuit for driving integrated power stages. In one embodiment, an output stage of an integrated gate driver includes two n-channel metal-oxide-semiconductor (NMOS) transistors for pull-up and pull-down paths. By using NMOS transistors in the pull-up path instead of the larger p-channel metal-oxide-semiconductor (PMOS) transistors, the circuit will have a reduced footprint. The output stage of an integrated gate driver with two NMOS transistors may also exhibit a reduced quiescent current. The quiescent current is the amount of current drawn from the power supply by the integrated gate driver while operating in standby mode. Thus, the reduced quiescent current may prolong the battery life of many battery-operated systems that incorporate the present invention.

The output stage comprising of two NMOS transistors for pull-up and pull-down paths uses a floating power supply above the source voltage to properly drive to the gate of a high-power transistor, such as a field-effect transistor ("FET")(e.g., power MOSFET). A bootstrap circuit may be used to generate the voltage for the gate drive of the high-side FET.

An embodiment of a gate driver with a bootstrap power supply circuit 100 is illustrated in FIG. 1. In the illustrated embodiment, gate driver includes a level shifter 102, a diode 104, buffers 110 and 120, a pull-down NMOS transistor 122, a pull-up NMOS transistor 112, and a bootstrap capacitor 130. Level shifter 102 may be configured to receive a pulse-width modulated (PWM) signal from a comparator (not shown). Subsequently, buffer 110 receives the level shifted pulse-width modulated signal and drives the pull-up NMOS transistor 112. Additionally, buffer 120 receives a pulse-width modulated signal and drives the pull-down NMOS transistor 122. Operation of the circuit illustrated in FIG. 1 is described in more detail below.

Output node 118 is connected to the source terminal of pull-up NMOS transistor 112 and the drain terminal of pull-down NMOS transistor 122. When output node 118 is pulled to ground by active pull-down NMOS transistor 122, diode 104 is forced into a forward-bias mode allowing current to flow from V1 voltage source into buffer 110 and through the loop from diode 104 through bootstrap capacitor 130, and NMOS pull-down transistor 122 to ground.

During the active period of pull-down NMOS transistor 122, bootstrap capacitor 130 accumulates electrical charge and exhibits a voltage proportional to the amount of deposited charge. When the pull-up NMOS transistor 112 is active, output node 118 is pulled to rail voltage 106 causing voltage at node 108 to be higher than the voltage provided by voltage source V1. Consequently, diode 104 becomes reverse-biased and blocks bootstrap capacitor 130 from discharging to voltage source V1.

During the active period of pull-up NMOS transistor 112, bootstrap capacitor 130 supplies the current required to maintain the NMOS pull-up transistor 112 in the active state. In particular, bootstrap capacitor 130 supplies a bias current for buffer 110 and transfers a portion of the accumulated electrical charge to charge the gate capacitor of NMOS pull-up transistor 112. This may result in an abrupt voltage decline across bootstrap capacitor 130.

Reverse leakage current of diode 104 and gate leakage current of NMOS pull-up transistor 112 may also result in reduction of voltage across bootstrap capacitor 130. Specifically, if the received pulse-width modulated input signal exhibits excessively high duty cycle, the voltage across bootstrap capacitor 130 may fall below a minimum value necessary to maintain the NMOS pull-up transistor 112 in the active state. In some embodiments, a charge pump (not shown) coupled to bootstrap capacitor 130 may refresh the electrical charge in bootstrap capacitor 130 and allow bootstrap capacitor 130 to maintain an electrical charge above the minimum threshold necessary to effectively drive NMOS pull-up transistor 112.

Figure 2:
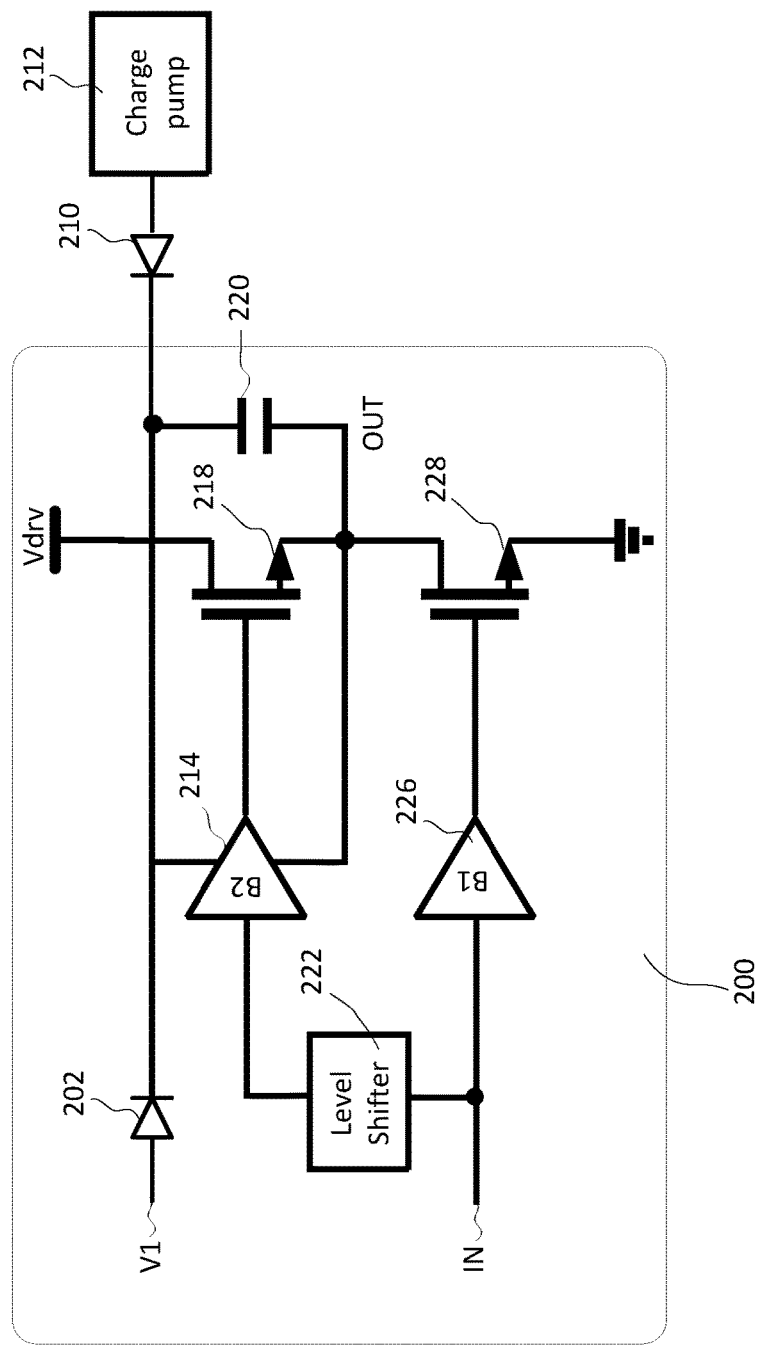
FIG. 2 illustrates an embodiment of a gate driver with a bootstrap power supply circuit and charge pump.

FIG. 2 illustrates a gate driver circuit 200 according to another embodiment. As illustrated, the gate driver circuit 200 includes a diode 202, buffers 214 and 226, a level shifter 222, pull-down NMOS transistor 228, a pull-up NMOS transistor 218, and a bootstrap capacitor 220. A ground based voltage supply V1 is coupled to diode 202 to peak charge bootstrap capacitor 220. Level shifter 222, coupling modulated input signal IN to buffers 214 and 216, is used to shift modulated input signal IN to subsequently drive the gate terminals of pull-up NMOS transistor 218 and pull-down NMOS transistor 228. Additionally, level shifter 222 may exhibit no substantial delays between the signals provided to pull-up NMOS transistor 218 and pull-down NMOS transistor 228.

In contrast to the embodiment of FIG. 1, the embodiment of FIG. 2 uses a charge pump module 212 coupled to bootstrap capacitor 220 via diode 210. Charge pump module 212 may be implemented as switched capacitor boost converter that boosts a supplied input voltage to a regulated output voltage. In this regard, the output voltage of charge pump module 212 may be configured, for example, to double, triple, halve, invert, fractionally multiply, or scale the supplied input voltage. Charge pump 212 may also be implemented as any other circuit that generates regulated high output voltage in other embodiments as would be understood by one skilled in the art. In various embodiments, charge pump 212 electrical characteristics may be selected as appropriate including: input voltage range, output voltage and current, internal capacitor values, oscillator frequency, and output voltage ripple. These characteristics are determined by charge pump 212 internal architecture. For example, the output voltage ripple exhibited by some high voltage charge pump circuits may exceed several hundred millivolts.

Charge pump 212 allows bootstrap capacitor 220 to charge during high duty cycles of pulse-width modulated input signal IN. As bootstrap capacitor 220 supplies an electrical charge required to maintain pull-up NMOS transistor 218 active, bootstrap capacitor 220 is continuously replenished with charge from charge pump 212.

In the configuration of FIG. 2, it may be difficult for charge pump 212 to provide an output voltage that is substantially the same as the sum of a voltage at the output node "OUT" and the maximum allowable gate overdrive voltage for pull-up NMOS transistor 218. For example, if the output voltage provided by charge pump 212 is too low, the efficiency of pull-up NMOS transistor 218 may be compromised. On the other hand, it may be appreciated that if the output voltage provided by charge pump 212 is too high, pull-up NMOS transistor 218 and buffer 214 may exhibit reduction in useful lifetime or possibly immediate circuit failure. Continued decrease in gate dielectric thickness due to the evolution in the CMOS manufacturing technologies may result in increased susceptibility to a gate dielectric breakdown.

For example, if a voltage across the gate dielectric layer exceeds the breakdown voltage of the dielectric material, dielectric breakdown may occur. This may result in an immediate failure of a transistor due to formation of less resistive path from the gate contact to the conductive channel. In addition, localized heating of the dielectric may also occur during the dielectric breakdown resulting in formation of a filament that shorts the transistor layers across the dielectric. Moreover, metal-oxide-semiconductor transistors have a maximum specified drain to source voltage, beyond which breakdown may occur. In particular, applying drain to source voltage in excess of the breakdown voltage may cause the transistor to conduct in an uncontrolled mode, potentially damaging it and other circuit elements due to excessive power dissipation. Thus, in order to avoid over-driving pull-up NMOS transistor 218 with excess voltage applied across the gate dielectric layer and eliminate the susceptibility of pull-up NMOS transistor 218 to gate dielectric breakdown, it is preferable to use a circuit module that regulates voltage across the bootstrap capacitor 220 which determines the supply voltage used to power buffer 214 and the gate overdrive voltage provided to the gate of pull-up NMOS transistor 218. To facilitate control of the voltage across bootstrap capacitor 220, a gate driver circuit with a replica bootstrap module (not shown) regulating the current flow from charge pump 212 may be implemented.

Figure 3:
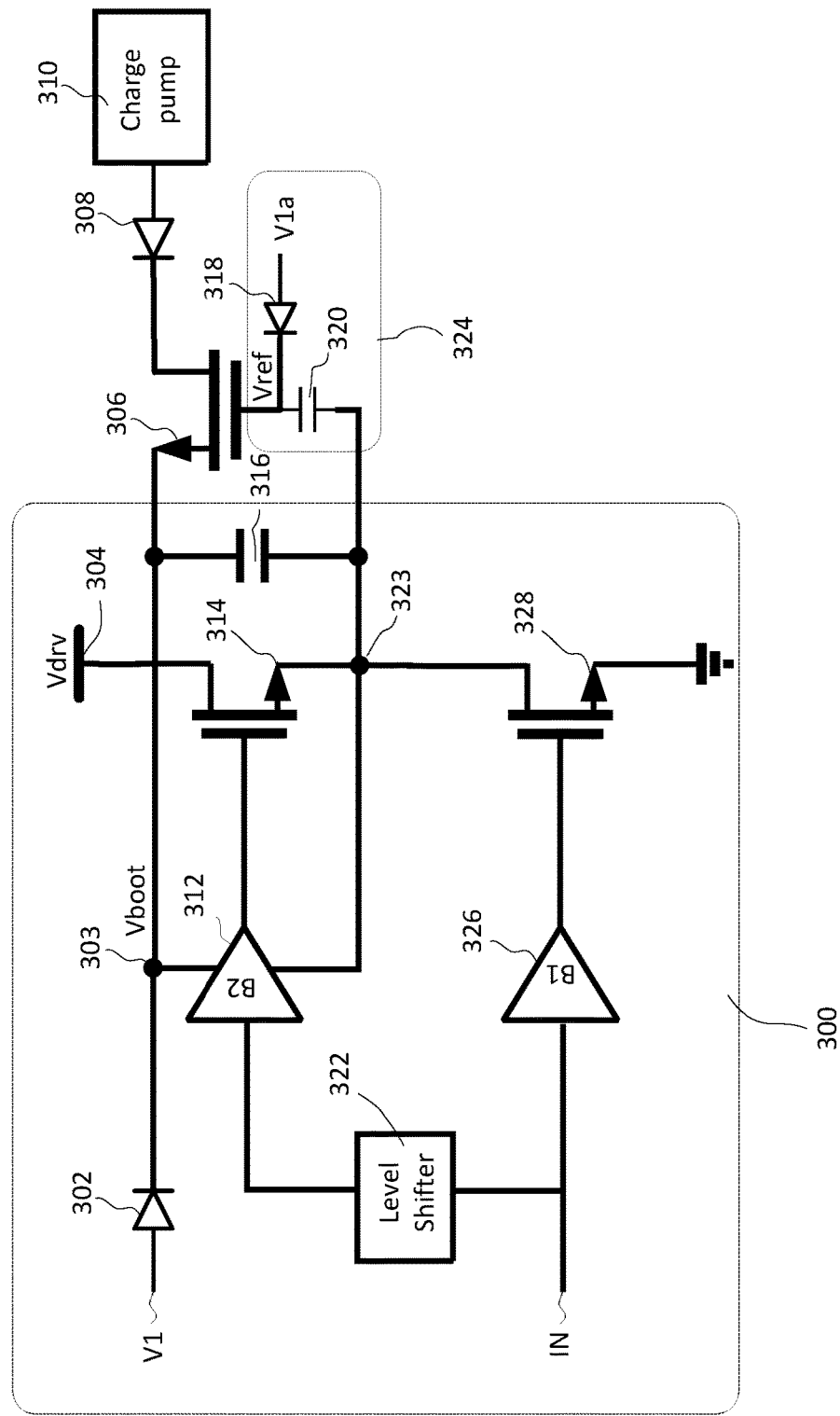
FIG. 3 illustrates a gate driver including a replica bootstrap power supply circuit in accordance with an embodiment of the disclosure.

FIG. 3 illustrates an embodiment of a gate driver circuit 300 with a replica bootstrap module 324. In FIG. 3, replica bootstrap module 324 includes voltage source V1a with an output voltage that is substantially the same as or slightly higher than the output voltage provided by voltage source V1. Voltage source V1a may be coupled, for example, with replica bootstrap capacitor 320 via diode 318. Replica bootstrap capacitor 320 may be connected across the source terminal of NMOS pull-up transistor 314 and the gate terminal of NMOS switch 306. This configuration allows NMOS switch 306 to selectively conduct current from its drain terminal, which is coupled to output diode 308 of charge pump 310, and to its source terminal, which is coupled to main bootstrap capacitor 316. It will also be appreciated that, NMOS switch 306 may conduct current between its drain and source terminals while operating in the sub-threshold or weak-inversion region. Operation of the circuit illustrated in FIG. 3 is described in more detail below.

When pull-down NMOS transistor 328 is active, the output node 323, coupled with the drain terminal of pull-down NMOS transistor 328, is effectively connected to ground through a small on resistance of pull-down NMOS transistor 328. In particular, low voltage at output node 323 allows forward-biased diodes 302 and 318 to conduct currents that charge main bootstrap capacitor 316 and replica bootstrap capacitor 320. In various embodiments, main bootstrap capacitor 316 is charged to V1-$VF_{DB1}$, where $VF_{DB1}$ is the forward voltage drop across diode 302. Similarly, replica bootstrap capacitor 320 is charged to V1a-$VF_{DB2}$, where $VF_{DB1}$ is the forward voltage drop across diode 318. The voltage provided by voltage source V1 may be the same as or slightly higher than the voltage provided by voltage source V1a.

Since main bootstrap capacitor 316 is coupled with the source terminal of transistor switch 306 and replica bootstrap capacitor 320 is coupled with the gate terminal of transistor switch 306, the voltage formed across capacitors 316 and 320 determine voltages at the source and gate terminals of transistor switch 306, respectively. As noted above, voltages provided by voltage sources V1 and V1a may be substantially the same.

In one embodiment, when pull-up NMOS transistor 314 is active, the voltage difference between output node 303 and the gate terminal of transistor switch 306 may exceed the threshold voltage of transistor switch 306 resulting in a formation of a conductive channel between the source and drain terminals of transistor switch 306. In particular, the formation of the conductive channel with excess charge carriers results in a drain current provided by charge pump 310 that charges main bootstrap capacitor 316 to a voltage level that is substantially close to the difference between the reference voltage provided by replica bootstrap circuit 324 and the threshold voltage of transistor switch 306.

In one embodiment, the reference voltage provided by replica bootstrap circuit 324 may be determined by the voltage at output node 323 and the sum of maximum allowable gate overdrive voltage for pull-up NMOS transistor 314 and the threshold voltage of transistor switch 306. The output voltage provided by charge pump 310 may be above the reference voltage provided by replica bootstrap circuit 324. More specifically, this ensures that a proper amount of charge is delivered to main bootstrap capacitor 316 during the active phase of pull-up NMOS transistor 314. In this regard, the output voltage of charge pump 310 does not need to be precisely controlled since the transistor switch 306 will turn-off when the voltage across bootstrap capacitor 316 is substantially close to the sum of the reference voltage provided by replica bootstrap circuit 324 and the threshold voltage of transistor switch 306. Thus, the voltage control across the main bootstrap capacitor 316 as described herein may eliminate the electrical overstress of buffer 312 and pull-up NMOS transistor 314 caused by the output voltage ripple exhibited at the output of charge pump 310.

Figure 4:
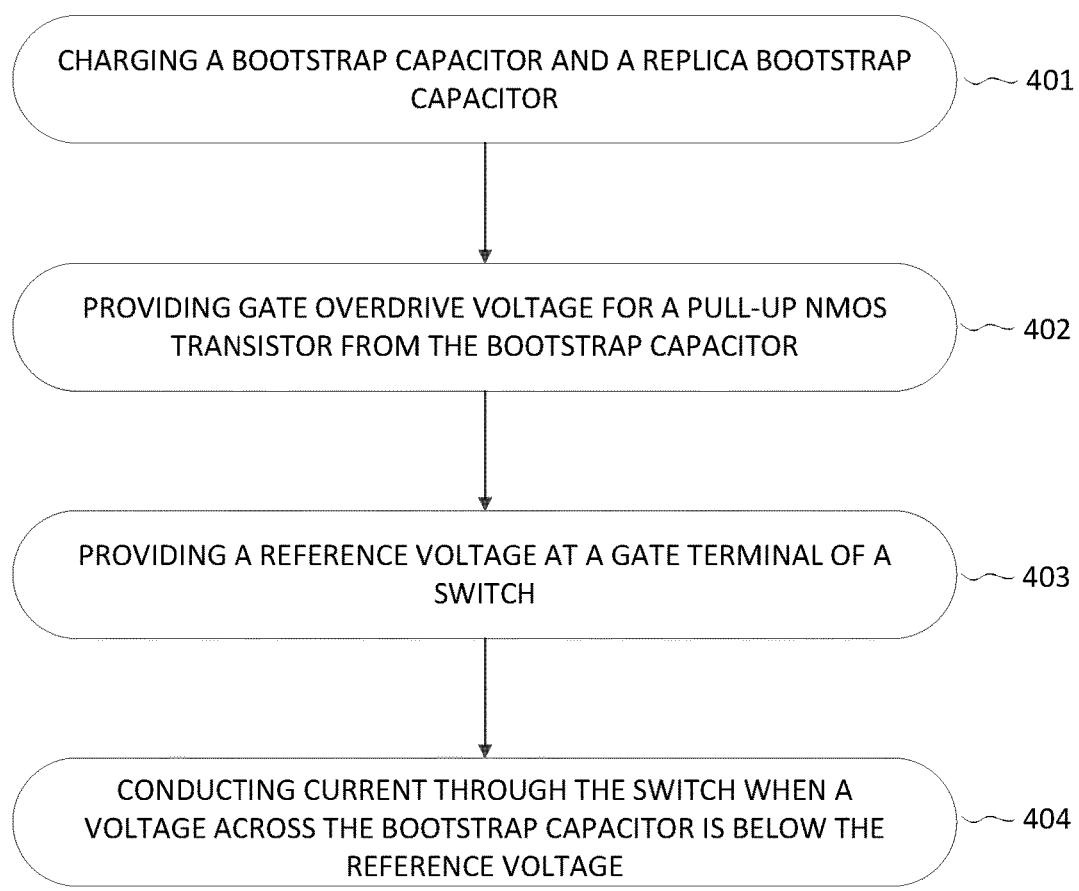
FIG. 4 illustrates a flow diagram of the operation of a replica bootstrap power supply circuit in accordance with an embodiment of the disclosure.

A flow diagram illustrated in FIG. 4 is an example of a method of operation of the gate driver extended with replica bootstrap regulator 324. The method begins in block 401, which includes charging bootstrap capacitor 316 and replica bootstrap capacitor 320, connected to the first and second voltage sources, respectively, through the first and second diodes.

When pull-up NMOS transistor 314 turns on, the voltage at the source terminal of NMOS pull-up transistor 314 approaches the $V_{drv}$ rail. Accordingly, the first and second diodes block the current flow from bootstrap capacitor 316 and replica bootstrap capacitor 320 to the first and second voltage sources, respectively.

At block 402, bootstrap capacitor 316 provides gate overdrive voltage for NMOS pull-up transistor 314. Charge balance occurs between bootstrap capacitor 316 and various load-capacitances coupled to bootstrap capacitor 316.

At block 403, replica bootstrap circuit 324 generates a reference voltage that controls transistor switch 306. In one embodiment, the reference voltage may set the gate voltage of NMOS switch 306. In various embodiments, the reference voltage depends on V1a voltage source, the forward-bias voltage of diode 318, and the RC time constant of replica bootstrap circuit 324.

At block 404, transistor switch 306 conducts current based on the voltage difference sensed between the reference voltage at the gate terminal of the transistor switch 306 and the voltage at the source terminal of the transistor switch 306. More specifically, charge redistribution between various load-capacitances coupled to bootstrap capacitor 316 may reduce the voltage drop across bootstrap capacitor 316, and may subsequently cause the voltage at the source terminal of the transistor switch 306 to fall below the reference voltage generated by replica bootstrap circuit 324. As a result, a sub-threshold current flowing from charge pump 310 may replenish bootstrap capacitor 316 with charge. When bootstrap capacitor 316 is charged close to the reference voltage, the voltage difference between the reference voltage at the gate terminal and the source terminal of NMOS switch 306 may approach zero causing transistor switch 306 to halt the current flow from charge pump 310 to bootstrap capacitor 316.

The operation of the gate driver, extended with the replica bootstrap circuit 324 described above, may be used to track the voltage across bootstrap capacitor 316 and subsequently force the voltage across bootstrap capacitor 316 to follow the reference voltage provided by replica bootstrap circuit 324. Also, the precise control of the voltage across bootstrap capacitor 316 may reduce electrical overstress of NMOS pull-up transistor 314. Moreover, since replica bootstrap circuit 324 replenishes lost electrical charge stored on bootstrap capacitor 316, a significantly smaller bootstrap capacitor 316, suitable for integration within gate driver circuit 300, may be used.

Figure 5:
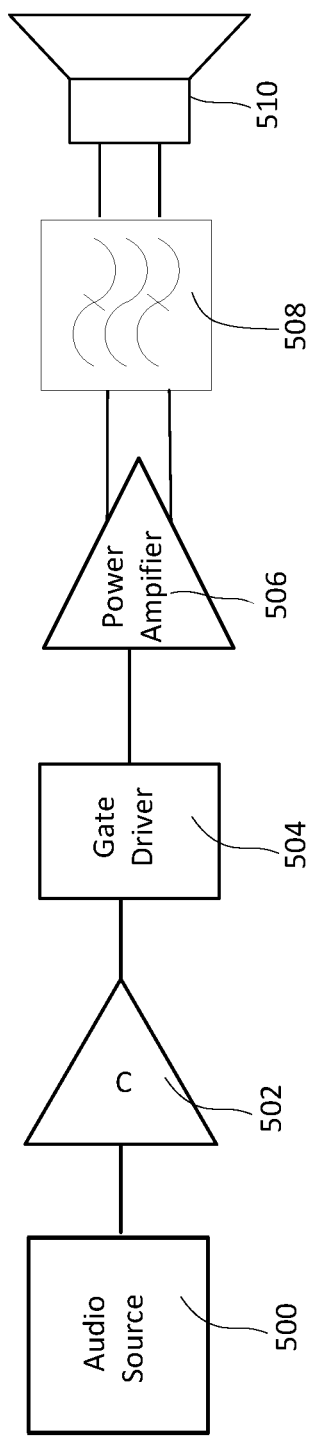
FIG. 5 illustrates a gate driver and power switch configured to deliver an amplified audio signal to a speaker in accordance with an embodiment of the disclosure.

FIG. 5 illustrates an audio signal processing system that amplifies an analog audio signal from audio source 500 and drives a speaker 510. As shown in FIG. 5, a power amplifier 506 may use gate driver 504 capable of producing large currents and generating high gate voltages (e.g., typically 15V or above). In these and other embodiments, gate driver 504 may also be implemented as a bootstrapped gate driver circuit 300 with replica bootstrap module 324 as described herein. In some embodiments, gate drive 504 may receive a train of pulse signals from comparator 502 and drive power amplifier 506. Comparator 502 is used to modulate an analog audio input signal into a series of pulses using pulse-width modulation (PWM), pulse density modulation, sliding mode control, delta-sigma modulation, or other modulation techniques. The modulated input signal is then amplified by power amplifier 506 where the average value of these pulses represents the instantaneous amplitude of the output signal. In one embodiment, power amplifier 506 may be implemented as a Class-D amplifier which unlike traditional amplifier produces an output comprising of series of pulses exhibiting unwanted high-frequency harmonics.

In one embodiment, output of the power amplifier 506 may be converted back to an analog signal using low pass filter 508, which removes the high-frequency harmonics from the series of output pulses and recovers the encoded audio information suitable for driving speaker 510.

Embodiments described above illustrate but do not limit the invention. It should also be understood that numerous modifications and variations are possible in accordance with the principles of the invention. Accordingly, the scope of the invention is defined only by the following claims.

What is claimed is:

1. A gate driver comprising:
    an output stage comprising an n-channel metal-oxide-semiconductor (NMOS) pull-up transistor and an NMOS pull-down transistor, wherein the NMOS pull-up transistor and the NMOS pull-down transistor are coupled at an output node;
    a bootstrap circuit comprising a main bootstrap capacitor, wherein the bootstrap capacitor provides a supply voltage for driving the NMOS pull-up transistor;
    a high voltage generator coupled with the main bootstrap capacitor via a transistor switch; and
    a replica bootstrap circuit comprising a replica bootstrap capacitor, wherein the replica bootstrap capacitor generates a reference voltage that regulates a drain current of the transistor switch, and wherein the regulated drain current of the transistor switch charges the main bootstrap capacitor from the high voltage generator;
    wherein the replica bootstrap circuit further comprises a first voltage source and a first diode, the first voltage source configured to charge the replica bootstrap capacitor via the first diode when the first diode is forward biased.

2. The gate driver of claim 1, wherein the reference voltage is substantially the same as a voltage generated by combining a voltage at the output node, a maximum allowed gate overdrive voltage, and a threshold voltage of the transistor switch.

3. The gate driver of claim 1, further comprising a second voltage source and a second diode, wherein the second voltage source charges the main bootstrap capacitor via the second diode when the second diode is forward biased.

4. The gate driver of claim 3, wherein a voltage provided by the second voltage source is less than or equal to the voltage provided by the first voltage source.

5. The gate driver of claim 1, further comprising a level shifter circuit configured to translate a voltage level of an input signal, wherein an output of the level shifter circuit is coupled to a gate of the NMOS pull-up transistor.

6. The gate driver of claim 1, further comprising a charge pump module, wherein the charge pump module charges a gate capacitance of the NMOS pull-up transistor and the main bootstrap capacitor when the transistor switch is conducting current.

7. The gate driver of claim 1, wherein the NMOS pull-up transistor occupies a larger die area than the transistor switch.

8. The gate driver of claim 1, wherein the replica bootstrap capacitor exhibits a substantially small capacitance.

9. The gate driver of claim 1, wherein the transistor switch conducts the drain current when a voltage across the main bootstrap capacitor is below the reference voltage by a threshold voltage of the transistor switch.

10. The gate driver of claim 1, wherein the transistor switch is an NMOS transistor switch.

11. A method for operating a gate driver for an integrated power stage comprising:
    charging a main bootstrap capacitor;
    charging a replica bootstrap capacitor from a first voltage source via a first diode when the first diode is forward biased;
    providing a supply voltage for driving a pull-up n-channel metal-oxide-semiconductor (NMOS) transistor from the main bootstrap capacitor;
    providing a reference voltage at a gate terminal of a transistor switch, wherein the reference voltage regulates a drain current of the transistor switch and wherein the regulated drain current of the transistor switch charges the main bootstrap capacitor from a high voltage generator; and
    conducting the drain current through the transistor switch when a voltage across the bootstrap capacitor is below the reference voltage by a threshold voltage of the transistor switch;
    wherein the replica bootstrap capacitor generates a reference voltage that regulates a drain current of the transistor switch.

12. The method of claim 11, wherein the reference voltage is substantially same as a voltage obtained by combining a voltage at an output node, a maximum allowed gate overdrive voltage, and the threshold voltage of the transistor switch.

13. The method of claim 11, wherein the main bootstrap capacitor is charged from a second voltage source via a second diode when the second diode is forward biased.

14. The method of claim 13, further comprising blocking a current flow from the main bootstrap capacitor to the second voltage source via the second diode, wherein the second diode is reverse biased during the blocking.

15. The method of claim 11, further comprising blocking a current flow from the replica bootstrap capacitor to the first voltage source via the second first diode, wherein the first diode is reverse biased during the blocking.

16. The method of claim 11, wherein the transistor switch conducts the drain current when a voltage across the main bootstrap capacitor is below the reference voltage by the threshold voltage of the transistor switch.

17. The method of claim 11, wherein the transistor switch is an NMOS transistor switch.

* * * * *

UNITED STATES PATENT AND TRADEMARK OFFICE
CERTIFICATE OF CORRECTION

PATENT NO. : 10,394,260 B2
APPLICATION NO. : 15/633527
DATED : August 27, 2019
INVENTOR(S) : Dan Shen and Lorenzo Crespi It is certified that error appears in the above-identified patent and that said Letters Patent is hereby corrected as shown below:

In the Specification
In Column 4, Line 19, change "pull-down" to --a pull-down--

In the Claims
In Column 9, Line 13, delete "second"

Signed and Sealed this
Fourteenth Day of April, 2020

Andrei Iancu
*Director of the United States Patent and Trademark Office*